United States Patent [19]

Wakimoto et al.

[11] Patent Number: 4,885,548
[45] Date of Patent: Dec. 5, 1989

[54] WIDEBAND AMPLIFIER

[75] Inventors: Tsutomu Wakimoto, Atsugi; Yukio Akazawa, Isehara, both of Japan

[73] Assignee: Nippon Telegraph and Telephone Corporation, Tokyo, Japan

[21] Appl. No.: 221,937

[22] Filed: Jul. 20, 1988

[30] Foreign Application Priority Data

Jul. 24, 1987 [JP] Japan .................. 62-183624

[51] Int. Cl.$^4$ .................. H03F 1/14; H03F 3/45
[52] U.S. Cl. .................. 330/260; 330/292; 341/159
[58] Field of Search .............. 330/76, 156, 260, 292; 341/115, 118, 159, 160

[56] References Cited

U.S. PATENT DOCUMENTS 3,678,405  7/1972  Avins .................. 330/260
4,646,002  2/1987  Tuszyski .............. 330/156 X

FOREIGN PATENT DOCUMENTS 0209334  1/1987  European Pat. Off. .
0263601  4/1988  European Pat. Off. .
2264812  4/1988  European Pat. Off. .

OTHER PUBLICATIONS

Benson et al., "DC Amplifier Having Fast Response to Step Waveform Inputs", *IBM Technical Disclosure Bulletin*, vol. 10, No. 8, Jan. 1968, pp. 1148–1149.
Turner, "Boostrap Boosts Gain of Low-Noise RF Preamp", *Electronics*, May 24, 1971, p. 57.
IEE Journal of Solid-State Circuits, vol. Sc-14, No. 4, pp. 734–741.
International Journal of Electronics, vol. 34, No. 3, 1973, pp. 423–427.

*Primary Examiner*—James B. Mullins
*Attorney, Agent, or Firm*—Frishauf, Holtz, Goodman & Woodward

[57] ABSTRACT

Wideband amplifier having a differential amplifier or single-ended amplifier and having a capacitaqnce compensation circuit is disclosed. The amplifier detects the voltage variations of a signal input node or a signal output node, generates a compensation current equal in magnitude and opposite in direction to a current flowing in a parasitic capacitance such as a transistor junction capacitance, and cancels the parasitic capacitance associated with a node by supplying the compensation current in a reverse phase to the node to which the parasitic capacitance is attached. As a result, a wideband amplifier is achieved, and it can also be used as a high-speed comparator. Further, harmonic distortions causing from the voltage dependency of the parasitic capacitance can be reduced by flowing the compensation current corresponding to a voltage impressed to the junction capacitance.

9 Claims, 12 Drawing Sheets

FLASH A/D CONVERTER

WIDEBAND AMPLIFIER

FIELD OF INVENTION This invention relates to wideband, low distortion, semiconductor amplifier.

BACKGROUND OF THE INVENTION

Prior to this invention it has been the practice to utilize a peaking technique, a cascode technique, a or base-collector capacitance compensation technique for achieving greater bandwidth. The outline of these techniques is as follows.

(1) PEAKING TECHNIQUE

FIG. 1 shows a differential amplifier using a peaking technique. In the figure, numerals 1, 2 designate signal input terminals, 3, 4 signal output terminals, 5, 6 transistors, 7, 8 resistors, 9 denotes a current source, 10 a peaking capacitor, 11, 12 feedback resistors, and 18 a dc voltage source. The peaking capacitor 10 is connected in parallel with feedback resistors 11, 12. This amplifier improves bandwidth by reducing low frequency gain with the feedback resistors 11, 12 and at the same time by reducing higher frequency feedback quantity with the peaking capacitor 10. The capacitor 10 works so as to vary a feedback characteristic around the negative feedback resistors 11, 12 and to approximate the voltage gain of the amplifier to that of an original circuit without the compensation. FIG. 2 shows that 3dB bandwidth increases from $f_{3dB0}$ to $f_{3dB1}$ by the effect of feedback resistors 11, 12, and further increases from $f_{3dB1}$ to $f_{3dB2}$ by the effect of the capacitor 10. Hence, the upper limit of such an amplifier is restricted by the frequency characteristic of the original circuit without negative feedback resistors and a peaking capacitor.

(2) CASCODE TECHNIQUE

FIG. 3 shows a differential amplifier using the cascode technique. In a common differential amplifier without transistors 15, 16, an input capacitance $C_{in}$ looking into the input terminal 1 or 2 is given by the following equation, because the input capacitance takes the value of the base-collector capacitance multiplied by the voltage gain G according to the Miller effect.

$$C_{in} = C_{BE} + C_{BC}(1+G) \tag{1}$$

Where $C_{BE}$ is a base-emitter capacitance and $C_{BC}$ is a base-collector capacitance.

In the circuit in FIG. 3, however, by the effect of the base-grounded transistors 15, 16, the collector impedances of the transistors 5, 6 become so small that the collector voltages are kept nearly constant. Hence, the Miller capacitances created by the base-collector capacitances of the transistors 5, 6 are canceled and so the input capacitance $C_{in}$ is represented by the following equation.

$$C_{in} = C_{BE} + C_{BC} \tag{2}$$

It shows that the input capacitance $C_{in}$ reduces by $C_{BC} \cdot G$. As a result, whereas this reduction of the input capacitance provides greater improvement in bandwidth with higher voltage gain, it provides lesser improvement with lower voltage gain. Moreover, the circuit has no effect on the reduction of the capacitances parasitic to the collector terminals, and has such additional disadvantages as (a) dynamic range of the amplifier becomes narrower since the transistors 15, 16 are connected in series with transistors 5, 6, (b) a power supply will be necessary for basebias voltages of the transistors 15, 16, (c) junction capacitances will increase because of the reduction of base-collector junction bias voltages, (d) slewing rate at large-signal swing reduces.

(3) BASE-COLLECTOR CAPACITANCE COMPENSATION TECHNIQUE

FIG. 4 shows a conventional amplifier increasing the bandwidth by eliminating base-collector capacitances of the input transistors 5, 6. The circuit eliminates the base-collector capacitances by feeding back the noninverting output to the noninverting input terminal via a capacitor 13 and the inverting output to the inverting input terminal via a capacitor 14. Designate the base-emitter capacitance of the transistor 5, 6 by $C_{BE}$, base-collector capacitance by $C_{BC}$, and voltage gain by G, then each input capacitance $C_{in}$ of transistors 5 and 6 looking into the input terminals is represented by the following equation.

$$C_{in} = C_{BE} + C_{BC}(1+G) \tag{3}$$

On the other hand, the value C' of capacitances 13, 14 seen looking into the input terminals are expressed as follows, because the voltages applied across the capacitors 13, 14 are opposite to the voltages applied to the base-collector capacitances of the transistors 5, 6.

$$C' = C(1-G) < 0 \tag{4}$$

Accordingly, choosing the value of C so that the absolute values of the Eqs. (3) and (4) become equal cancels the input capacitances of the transistors 5, 6, resulting in the increase in the bandwidth of the amplifier. The increase in the bandwidth, however, is adversely affected by the increase in the time constants of the output terminals which is produced by the increase in the output capacitances. The increase in the output capacitances by the amount C of the capacitances 13, 14 is caused because the other terminals of the capacitances 13, 14 or the opposite terminals to those connected to the signal input terminals are connected to the collectors of the transistor 5, 6. The technique has a further disadvantage that it cannot be applied to circuits other than differential amplifiers.

In applying the technique to integrated circuits, the capacitances 13, 14 are usually replaced with transistor junction capacitances 13a, 14a shown in FIG. 5. In this case, the time constant at each collector further increases, because collector-substrate capacitance of the transistor 13a or 14a as well as its base-collector capacitance is added to the collector capacitance of the transistor 5 or 6.

SUMMARY OF THE INVENTION

It is therefore an object of this invention to provide a wideband and high-speed amplifier by canceling a transistor junction capacitance or a load capacitance which limits the bandwidth of the amplifier by producing a negative capacitance within the circuit.

Another object of this invention is to provide a wideband amplifier by reducing not only Miller capacitance parasitic to the input node of the amplifier but also other capacitance parasitic to other nodes, e.g. output nodes. In other words, this invention provides a wideband amplifier without increasing the output node capacitance and degrading the slewing rate.

A further object of this invention is to decrease harmonic distortions of an amplifier caused by the voltage dependency of a junction capacitance. This is achieved in such a way that a compensation current in proportion to a voltage impressed to a junction capacitance is flowed into the capacitance.

According to the present invention, there is provided a wideband amplifier comprising:

(a) a differential amplifier having at least two transistors;
(b) follower circuits for detecting voltage variation of an input or an output node of each of said transistors;
(c) at least one capacitance connected to output terminals of the follower circuits for producing compensation currents equal and opposite to currents flowing in input capacitance of the transistors; and
(d) means for applying each of the compensation currents to each of the input node of the transistors.

BRIEF DESCRIPTION OF THE DRAWINGS

FIG. 1 is a schematic circuit diagram of a differential amplifier with a peaking compensation technique;

FIG. 2 is a graphic representation of the frequency characteristic of the above amplifier;

FIG. 3 is a schematic circuit diagram of a differential amplifier with a cascode technique;

FIG. 4 and FIG. 5 are, respectively, schematic circuit diagrams of a differential amplifier with a base-collector capacitance compensation technique;

FIG. 6 is a schematic diagram to explain an input capacitance of a conventional amplifier;

FIG. 7 is a schematic diagram for explaining the basic principle of this invention;

FIG. 8 is a graphic representation illustrating an improved frequency characteristic of the present invention;

FIG. 9 is a circuit diagram of a base-capacitance compensation differential amplifier according to embodiment 1 of the invention;

FIG. 10 is an example of the compensation capacitance;

FIG. 11 is a graphic representation illustrating the voltagegain characteristic of the above embodiment 1;

FIG. 12 is a graphic representation illustrating the voltagegain characteristics with a variation of the value of the compensating capacitance;

FIG. 13($a$) and 13($b$) are time-charts illustrating input and output waveforms obtained from the circuit simulations wherein differential amplifiers are employed as comparators of a high-speed flash A/D-converter; FIG. 13($a$) is a graphic representations illustrating the response time of a conventional wideband amplifier, and FIG. 13($b$) is a graphic representation illustrating the response time of the embodiment 1;

FIG. 14–FIG. 18 are, respectively, circuit diagrams of base-capacitance compensation differential amplifiers according to the embodiment 2 to embodiment 6 of the present invention;

FIG. 19 is a circuit diagram of a collector-capacitance compensation differential amplifier according to the embodiment 7 of the invention;

FIG. 20 is a graphic representation of a voltage gain characteristic of the embodiment 7;

FIGS. 21 and 22 are, respectively, circuit diagrams of collector-capacitance compensation differential amplifiers according to the embodiments 8 and 9 of the invention;

FIG. 23–FIG. 25 are, respectively, circuit diagrams of base-capacitance compensation single-ended amplifiers according to the embodiments 10, 11, and 12 of the invention;

FIG. 26–FIG. 28 are, respectively, circuit diagrams of collector-capacitance compensation single-ended amplifiers according to the embodiments 13, 14, and 15 of the invention;

FIG. 29 is a circuit diagram of the embodiment 16 of the invention being applied to a flash A/D converter;

FIG. 30 is a graphic representation of voltage-gain characteristics of the base-capacitance compensation differential amplifier and the collector-capacitance compensation differential amplifier.

DESCRIPTION OF THE PREFERRED EMBODIMENT OF THE INVENTION

Figure 1:
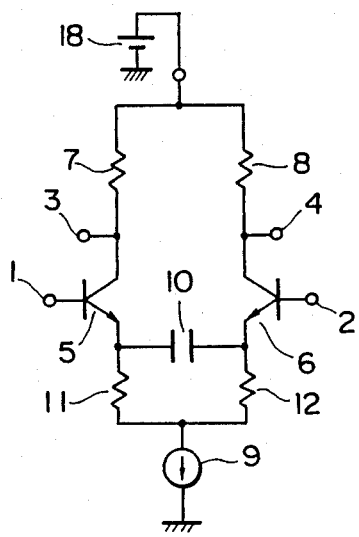
FIG. 1–FIG. 6 are drawings for explaining prior arts.
Figure 3:
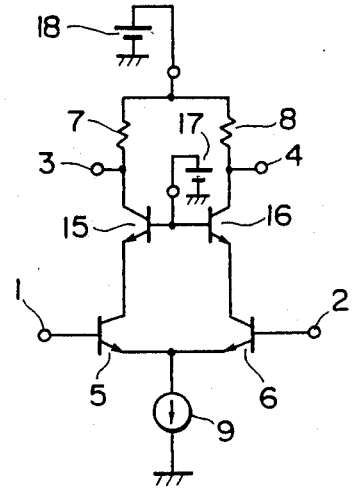
Figure 2:
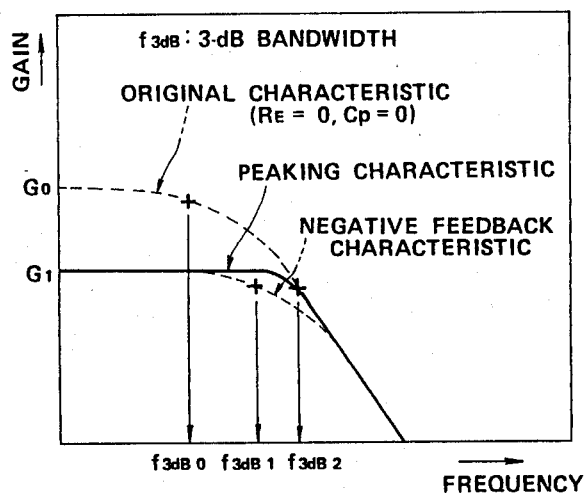

The invention will now be described with reference to the drawings in which like reference numerals denote corresponding parts throughout the drawings.

First, referring to FIG. 6–FIG. 8, the principle of the invention will be described in contrast with the conventional technique.

Figure 6:
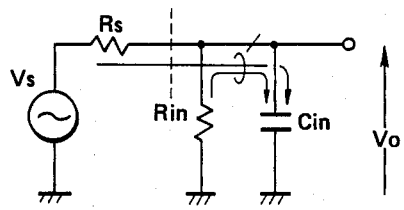
Figure 7:
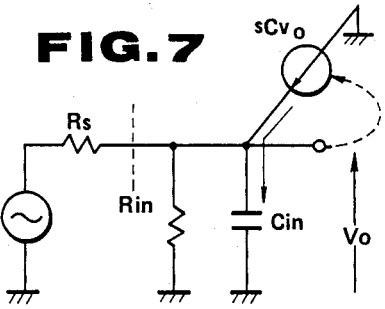
FIG. 7–FIG. 30 are circuit diagrams of wideband amplifiers employing the capacitance compensation techniques of the present invention, or graphic representations illustrating the characteristics of the amplifiers.

FIG. 6 is a schematic representation of a conventional circuit having an input resistor $R_{in}$ and an input capacitance $C_{in}$. The frequency characteristic of the circuit will be considered when it is driven by a signal source with an impedance of $R_s$. Low frequency gain $G_0$, 3-dB bandwidth $f_{3dB0}$, and gain-bandwidth product (GB product) $GB_0$ are represented as follows.

$$G_0 = (R_{in}//R_s)/R_s \quad (5)$$

$$f_{3dB0} = 1/\{2\pi C_{in}(R_{in}//R_s) \quad (6)$$

$$GB_0 = G_0 \cdot f_{3dB0} = 1/(2\pi C_{in} R_s) \quad (7)$$

Thus, the 3-dB bandwidth $f_{3dB0}$ and the gain-bandwidth product $G_{B0}$ are determined by the input capacitance $C_{in}$ and the input resistance $R_{in}$. For increasing the bandwidth of the circuit, reduction of $R_{in}$ or $C_{in}$ is required because $R_s$ is constant. Concerning the reduction of $R_{in}$, though it improves the 3-dB bandwidth, it keeps the GB product constant as shown in Eq. (7) because the voltage gain is decreased by the reduction of the $R_{in}$. On the other hand, since the reduction of $C_{in}$ improves the 3-dB bandwidth with the low frequency voltage gain keeping constant, the GB product will also be improved. In the circuit shown in FIG. 6, equivalent input capacitance seen by a signal source looking into the input terminal can be decreased by supplying a current which will flow in the input capacitance $C_{in}$ using another current source. It is the principle of the invention, and a method of it is shown in FIG. 7. First, the voltage $v_0$ impressed to the input capacitance is detected, then a compensation current of the same phase as the current flowing in the $C_{in}$ is produced by converting the voltage $v_0$. This compensation current is applied to the $C_{in}$. Assume that the value of the compensation current to be $sCv_0$ (where s is the Laplace transform operation), then the 3-dB bandwidth of the circuit shown in FIG. 7 is represented by the following equation using the Eq. (6).

$$f_{3dB1} = 1/\{2\pi(C_{in}-C)(R_{in}//R_s)\} \quad (8)$$

The GB product GB1 is represented as follows by substituting the Eqs. (5), (8) into the Eq. (7).

$$GB_1 = G_0 \cdot f_{3dB1} = 1/\{2\pi(C_{in}-C)R_s\} \quad (9)$$

In this case, as the value of C increases from zero, the current flowing in the input capacitance is better compensated. As a result, not only the 3-dB bandwidth but also the GB product GB1 is improved. When $C = C_{in}$, the input capacitance $C_{in}$ is completely canceled, and the 3-dB bandwidth will become theoretically infinite.

Figure 8:
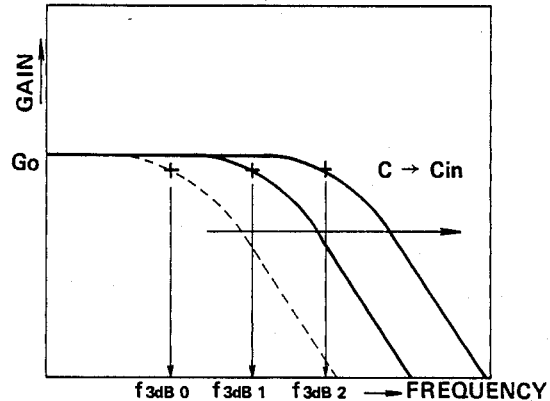

This behavior of the compensation is shown in FIG. 8. Although, in a practical amplifier, many higher frequency poles resulting from junction capacitances in various parts of the circuit limit the 3-dB bandwidth to a finite value, dominant poles are moved into a high-frequency region and wideband characteristics can be achieved using the invention.

EMBODIMENT 1

Figure 9:
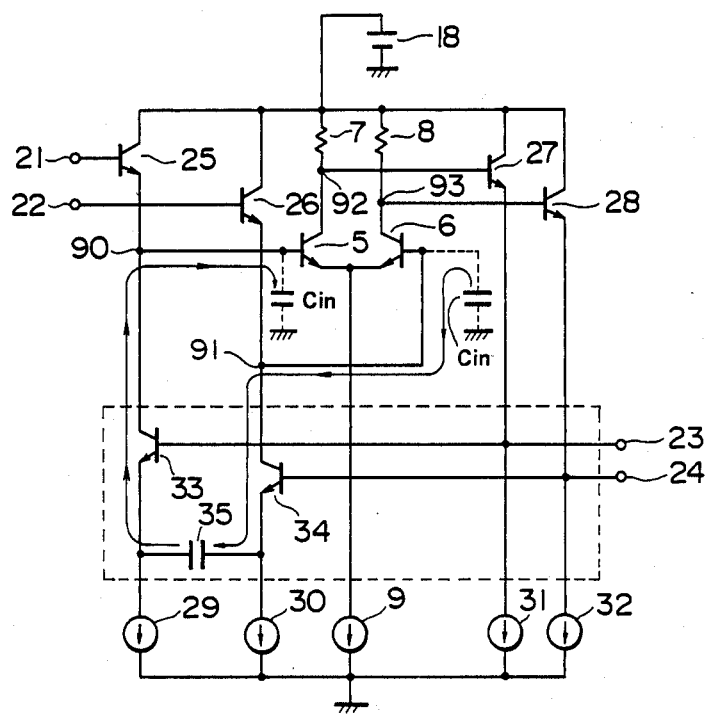

The first embodiment obtained by applying the invention to a differential amplifier is shown in FIG. 9.

The major bandwidth limitations of this kind of differential amplifier are as follows.

(1) The limitation by base capacitance

Capacitance parasitic to base terminal of a transistor 5 or 6 (that is, the Miller capacitance of base-collector capacitance of a transistor 5 or 6, and base-emitter capacitance), and the source impedance seen by the base terminal looking back to a signal source form a time constant, which is the first limitation of the bandwidth. Embodiments 1-6, 10-12 mentioned below will compensate the limitation.

(2) The limitation by collector capacitance

Capacitance parasitic to collector terminal of a transistor 5 or 6 (that is, collector-base capacitance and collector-substrate capacitance of the transistor 5 or 6), and a load resistor R1 or R2 forms another time constant, which is the second limitation of the bandwidth. Embodiments 7-9, 13-15 mentioned below will compensate the limitation. The embodiment 1 shown in FIG. 9 is an example of applying the invention for canceling base-capacitance, which corresponds to (1) above.

In FIG. 9, numerals 21, 22 denote input signal terminals, 23, 24 output signal terminals, 25-28, 33, 34 transistors, 29-32 current sources, 35 compensation capacitances, 90, 91 signal input nodes, and 92, 93 signal output nodes. The transistors 27, 28 compose emitter-follower circuits, whereas the transistors 33, 34 and the compensation capacitance 35 compose a Miller capacitance compensation circuit (shown by a broken-line block). More specifically, the Miller capacitance compensation circuit, having the emitter-follower transistors 33, 34 and the compensation capacitance 35 connected between the output terminals of the transistors 33, 34, is arranged in such a manner that the transistor 34 is driven by the non-inverted output of the differential amplifier (that is, the collector voltage of the transistor 6) detected by the transistor 28, and the transistor 33 is driven by the inverted output (that is, the collector voltage of the transistor 5) detected by the transistor 27. Thus, being detected by the transistors 27, 28, the collector voltage difference between the transistors 5, 6 is applied to the capacitance via transistors 33, 34, and converted to a compensation current. With the increase in the voltage of the node 90 (the base terminal of the transistor 5), for example, the compensation current converted by the capacitance 35 will flow into the node 90. As a result, the compensation capacitance 35 seen looking into the base terminal of the transistor 5 or 6, becomes a negative capacitance.

Let's designate voltage gain of the differential amplifier by G, base-collector capacitance of the transistors 5, 6 by $C_{BC1}$, and base-emitter capacitance by $C_{BE1}$. Then, the input capacitance of the transistors 5, 6 is represented by the following equations according to Miller effect.

$$C_{in} = C_{BE1} + C_{BC1}(1+G) \quad (10)$$

On the other hand, a value $C_{1'}$ of the compensation capacitance 35 seen looking into the base terminal of the transistor 5 or 6 is expressed by the following equation, because the compensation current from the capacitance compensation circuit flows into the input capacitance $C_{in}$ as shown in FIG. 9.

$$C_{1'} = -2GC_1 \quad (11)$$

As a result, choosing the value of $C_l$ of the compensation capacitance 35 so that the absolute values of the Eqs. (10) and (11) become equal cancels the input capacitances of the transistors 5 and 6 resulting in the high-speed amplifier.

Figure 10:
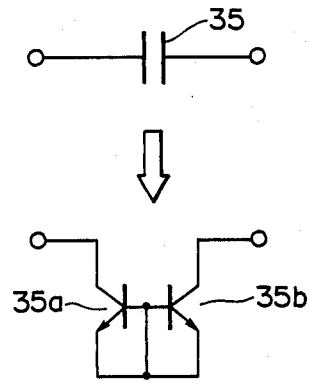
Figure 11:
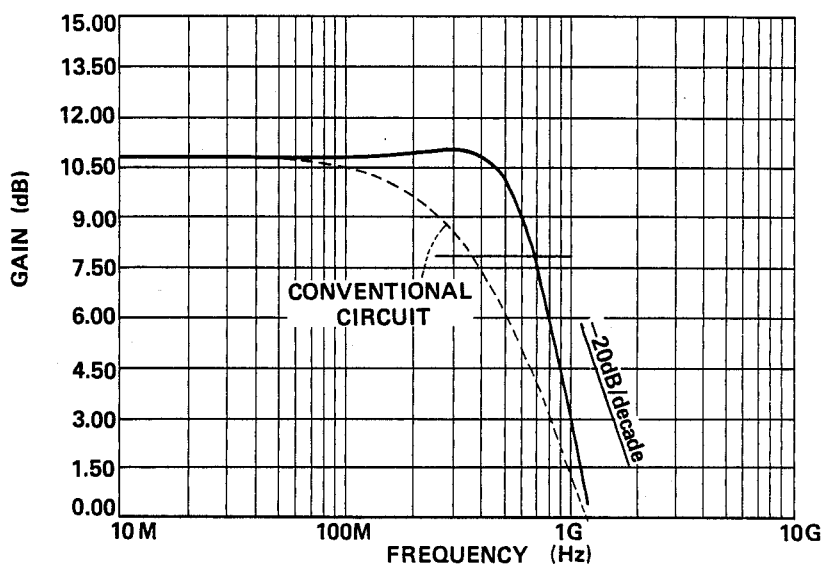

More specifically, if base-collector capacitances of transistors 33, 34 are negligible compared with base-collector capacitances of transistors 5, 6, the $C_{in}$ will be canceled and the bandwidth will be increased by choosing the value of the input capacitance $C_{in}$ of the transistors 5, 6 equal to $2G_1C_1$. On the other hand, if base-collector capacitance $C_{BC2}$ of transistors 33, 34 are not negligible, the capacitance of the transistor 33 seen looking into the node 90 will become $C_{BC2}(1+G_1)$ by the Miller effect. As a result, choosing the sum of the value $C_{BC2}(1+G_1)$ and $C_{in}$ equal to $2G_1C_1$, the capacitance of the node 90 will be canceled and a high-speed differential amplifier is achieved. The above description holds true at the node 91 as well as at the node 90. In applying the technique to integrated circuits, matching compensation capacitance 35 with the junction capacitance of the transistors 5, 6 is important. Hence, the compensation capacitance 35 may be replaced with junction capacitances of transistors 35a, 35b as shown in FIG. 10. The frequency characteristic of this case is shown in FIG. 11 by a solid curve. The 3-dB bandwidth of the amplifier is around 700 MHz which is 1.9 times larger than about 360 MHz of a conventional circuit (shown by a dotted-curve).

Figure 12:
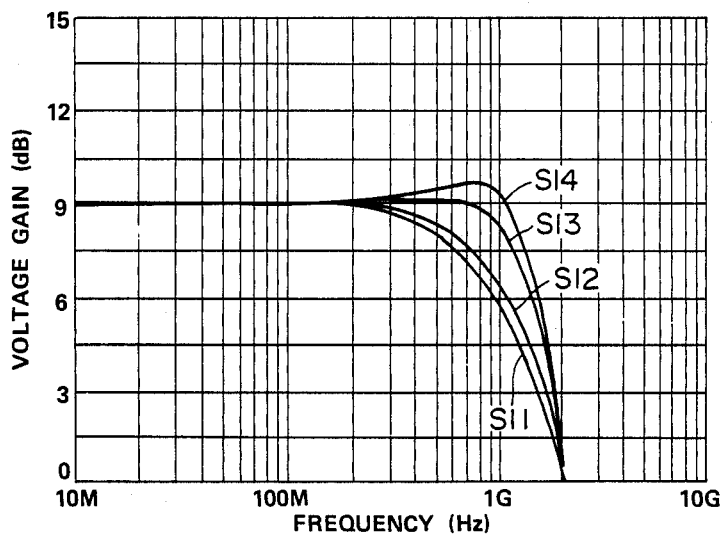

FIG. 12 shows the result obtained by the circuit simulation concerning to the frequency characteristics of voltage gain of the embodiment 1. In this case, circuit parameters are different from those associated with FIG. 11.

In FIG. 12, a curve S11 corresponding to $C_1 = 0$ ($C_1$ is the value of the compensation capacitance 35) which approximates to the characteristic of a conventional wideband amplifier. A curve S12 corresponds to $C_1 = 5fF$, a curve S13 $C_1 = 15fF$, a curve S14 $C_1 = 20fF$. As is found by comparing the curve s11 with S14, the Miller capacitance of the transistors 5, 6 are canceled by the optimum choice of the value $C_l$, and the 3-dB bandwidth increases by a factor 1.6 from 940 MHz to 1.5 GHz.

Figure 13:
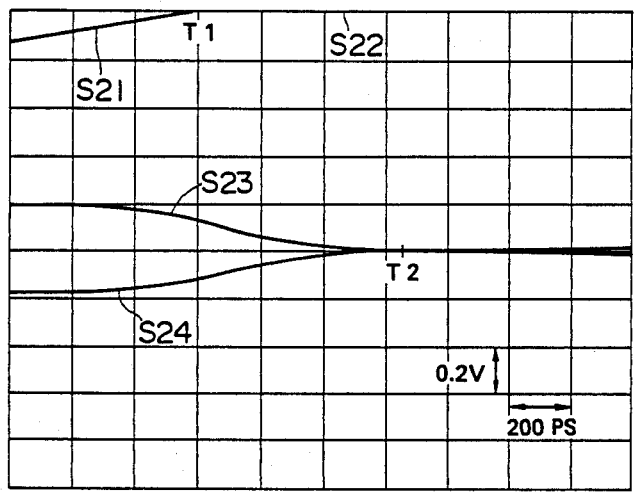
Figure 13:
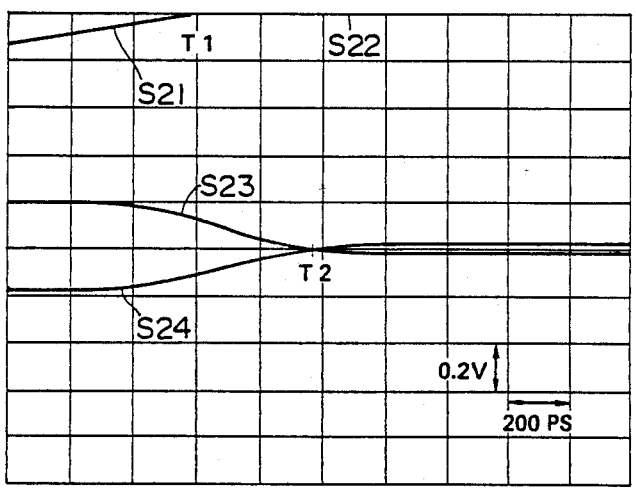

FIG. 13 is timing charts illustrating input and output waveforms obtained from the circuit simulation wherein the differential amplifier shown in FIG. 9 is applied as a high-speed comparator to a flash A/D converter. In this case, circuit parameters are the same as those associated with FIG. 12, and the overdrive voltage is 4mV. In FIG. 13, a curve S21 shows the signal waveform at the signal input terminal 21, a curve S22 shows the signal (a constant signal) waveform at the signal input terminal 22, a curve S23 shows the signal waveform at the signal output terminal 23, and a curve S24 represents the waveform at the signal output terminal 24.

FIG. 13(a) illustrates curves obtained in the case of $C_1=0$, which corresponds to a conventional comparator. The response time, the elapsed time during the point T1 and T2 and is represented by the term (T2-T1), is about 650 ps. The point T1 is the instant when the inversion of the voltages at the signal input terminals 21, 22 took place and the point T2 is the instant when the inversion of voltages at the signal output terminals occurred. FIG. 13(b) illustrates curves obtained in the case of $C_1=20fF$. The response time is about 370 ps (=T3-T1), which is improved by 43 percent compared with a conventional comparator.

EMBODIMENTS 2, 3

Figure 14:
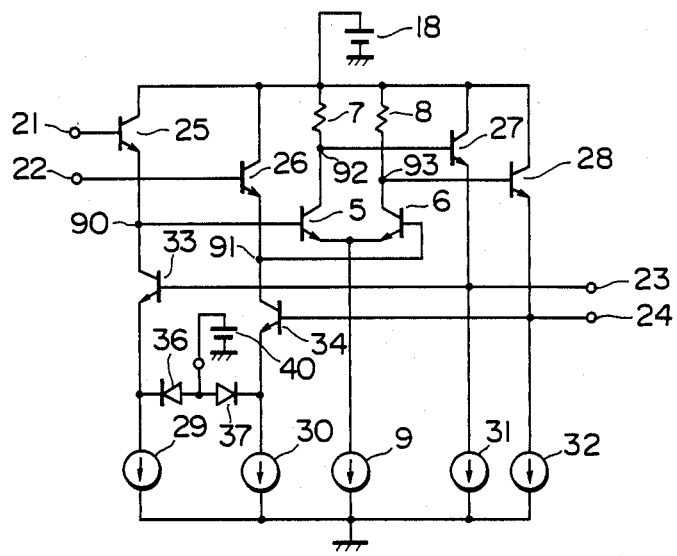
Figure 15:
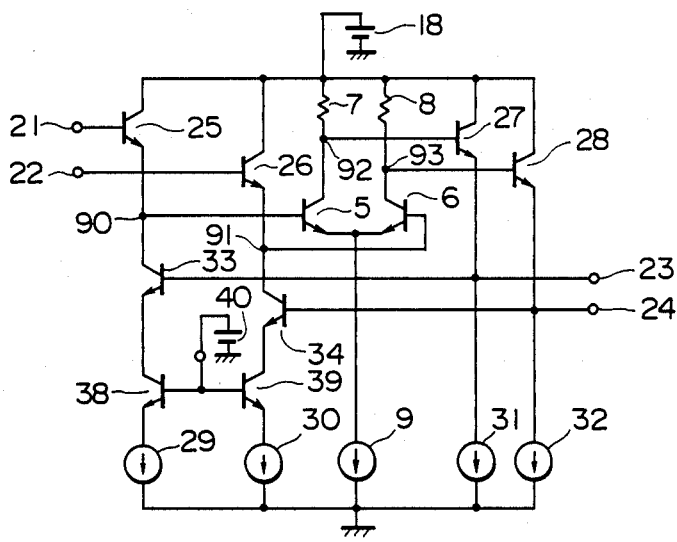

FIG. 14 and 15 are circuit diagrams of the second and third embodiments of the invention. In these embodiments, the compensation capacitance 35 of embodiment 1 is replaced by junction capacitances of diodes 36 and 37 or transistors 38 and 39. And a voltage source 40 is provided for adjusting the bias voltages of the diodes or the transistors. In applying the invention to a monolithic integrated circuit, there takes place a problem that the optimum bandwidth cannot be achieved because of the inconsistency of capacitance. The present embodiments 2, 3, however, have the advantage that they can achieve the optimum compensation by adjusting the bias voltages of the diodes or transistors.

EMBODIMENT 4

Figure 16:
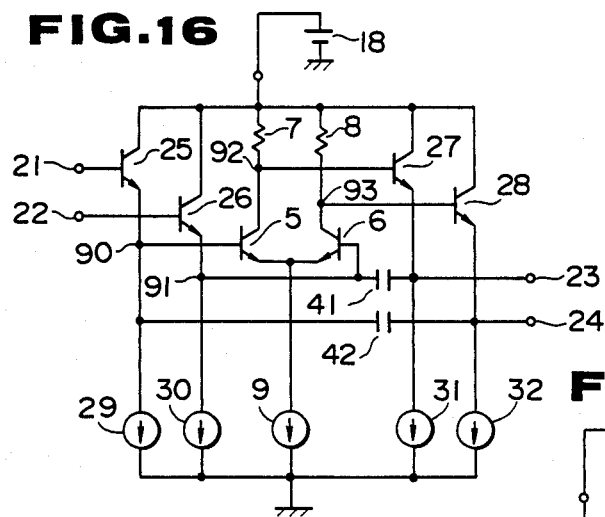

FIG. 16 is a circuit diagram according to the fourth embodiment of the invention. Each of voltages across compensation capacitances 41 and 42 connected as shown in FIG. 16 has opposite phase to each of the base-collector voltages of the transistor 6 and 5. As a result, the compensation capacitance 41 or 42 whose value is $C_2$ is seen $C_2(1-G_1)$ looking into the node 90. Accordingly, choosing the value of $C_2$ so that the absolute value $C_2(1-G_1)$ will become equal to the input capacitance $C_{in}=C_{BC1}(1+G_1)$ cancels the $C_{in}$ resulting in the wideband differential amplifier. In this case, the base-emitter capacitance $C_{BE1}$ is neglected because it is very small.

Figure 4:
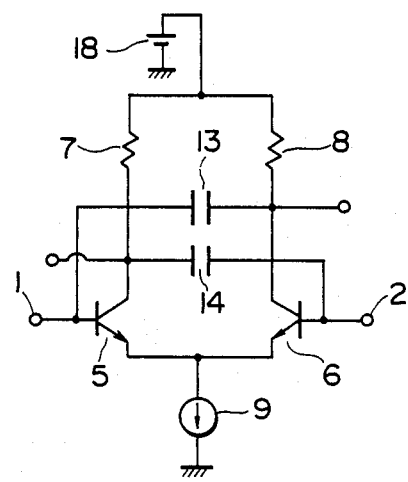
Figure 5:
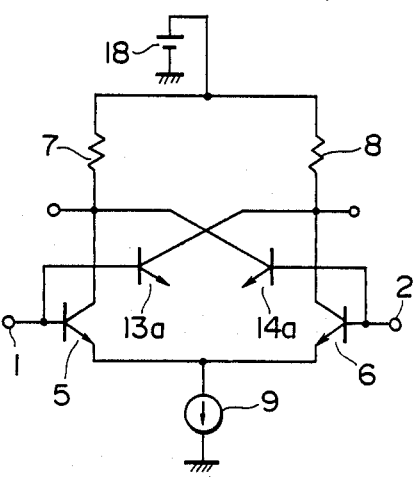

In the conventional differential amplifier shown in FIG. 4, there was a problem that the compensation capacitances inserted between the base and collector of the transistors 5, 6 increase their collector capacitances resulting in the decrease in the bandwidth of the differential amplifier. The present embodiment 4, however, solves the problem by the buffer effect of transistors 27 and 28. In FIG. 16, each transistor 27, 28 comprises emitter-follower circuit, and the compensation capacitances 41, 42 comprise a capacitance compensation circuit.

EMBODIMENTS 5, 6

Figure 17:
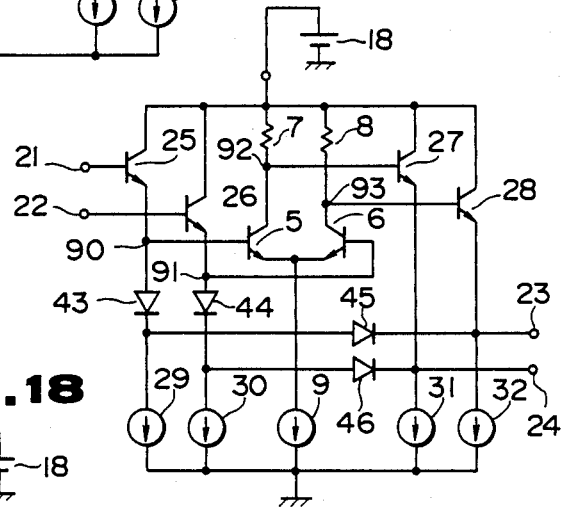
Figure 18:
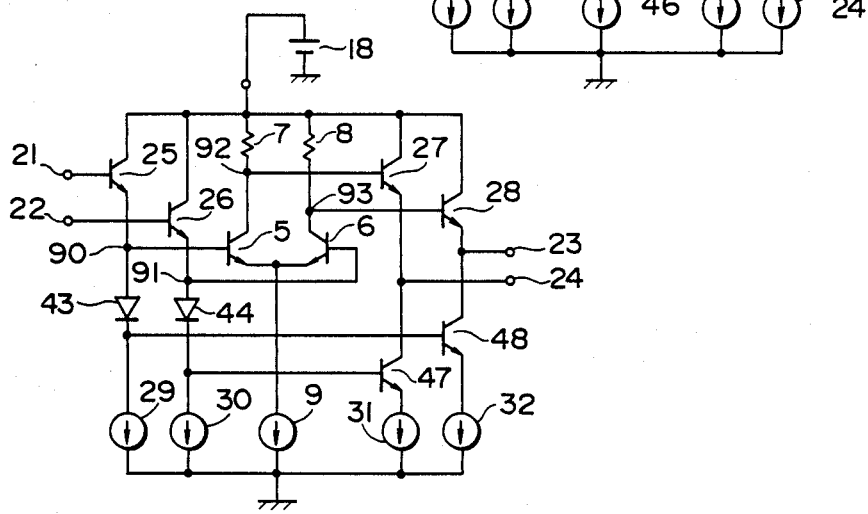

FIG. 17 and 18 are the fifth and sixth embodiments of the invention wherein the fixed compensation capacitances 41 and 42 of the embodiment 4 are replaced by the junction capacitances of diodes 45 and 46, or transistors 47 and 48. Diodes 43 and 44 are level-shift diodes used for matching the bias voltage levels impressed to the junction capacitances of the diodes 45 and 46 or the transistors 47 and 48 with the base-collector voltage levels of the transistors 5 and 6.

EMBODIMENT 7

Figure 19:
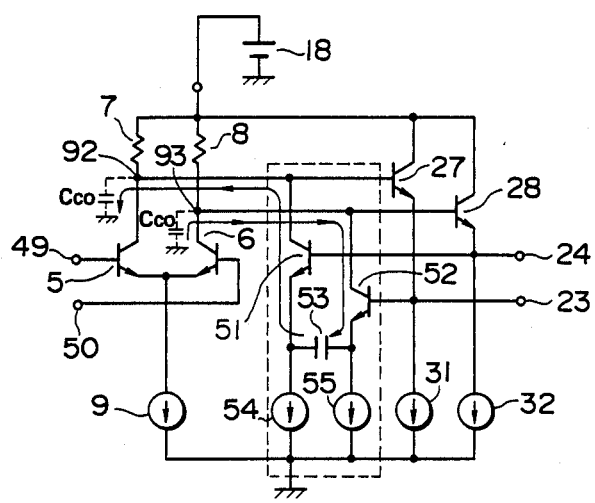

FIG. 19 shows the seventh embodiment wherein the present invention is applied for canceling parasitic capacitance to collector nodes 92, 93 of the transistors 5 and 6. A collector capacitance compensation circuit (shown by a broken-line block) comprises emitter-follower transistors 51, 52 a compensation capacitance 53 connected between the output terminals of the transistors 51, 52, and current sources 54, 55. The compensation circuit produces a compensation current by converting the difference of voltage levels between output nodes 92 and 93 which are detected with the transistors 27 and 28, and applies the compensation current to the output nodes 92 and 93. The compensation current, as shown in FIG. 19, is directed so that it flows into the node 92 when the voltage of the node 92 increases (the current path is shown by arrows in the FIG. 19). As a result, the value $C_3$ of the compensation capacitance 53 seen looking into the collector of the transistor 5 takes a negative value $C_3'$ as the following equation.

$$C_3' = -2C_3 \quad (12)$$

Figure 20:
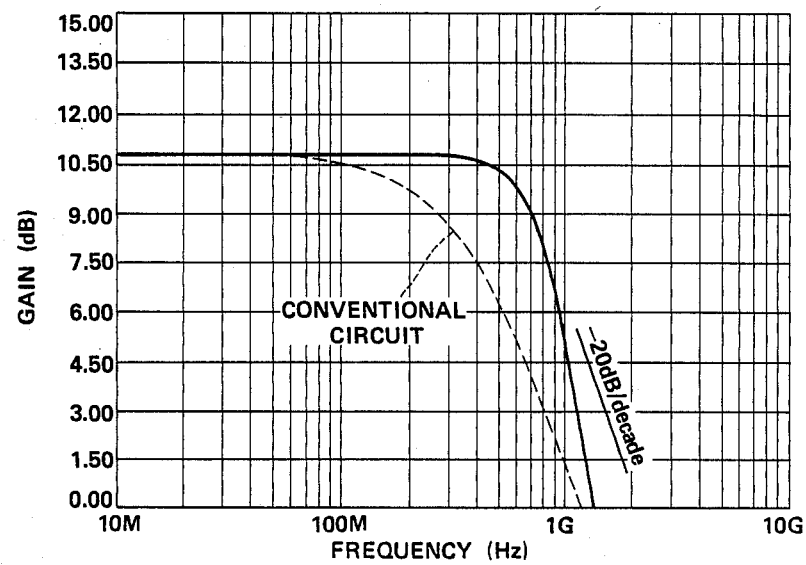

On the other hand, the collector capacitance $C_{c0}$ of transistor 5 or 6 is expressed as $$C_{c0} = C_{BC1} + C_{SUB1} + C_{BC7} \quad (13)$$

where $C_{BC1}$ designates the base-collector capacitance of the transistors 5, 6, $C_{SUB1}$ denotes collector-substrate capacitance, an $C_{BC7}$ the base-collector capacitance. Hence, choosing the value $C_3$ of the compensation capacitance 53 so that the absolute values of the Eqs. (12) and (13) take the same value cancels the collector capacitances of the transistors 5, 6 and achieves the high-speed amplifier. The frequency characteristic of the amplifier, wherein the compensation capacitance 53 is composed of transistor junction capacitances shown in FIG. 10, is represented in FIG. 20 by a solid curve. The 3-dB bandwidth is about 800 MHz, which is 2.2 times as large as that of a conventional amplifier shown by a dotted curve. Further, a response time of the embodiment employed as a high-speed comparator for a flash A/D convertor is 571 ps, reducing the conventional response time of 1110 ps by 49 percent. In this case, circuit parameters are the same as those associated with FIG. 11.

EMBODIMENT 8

Figure 21:
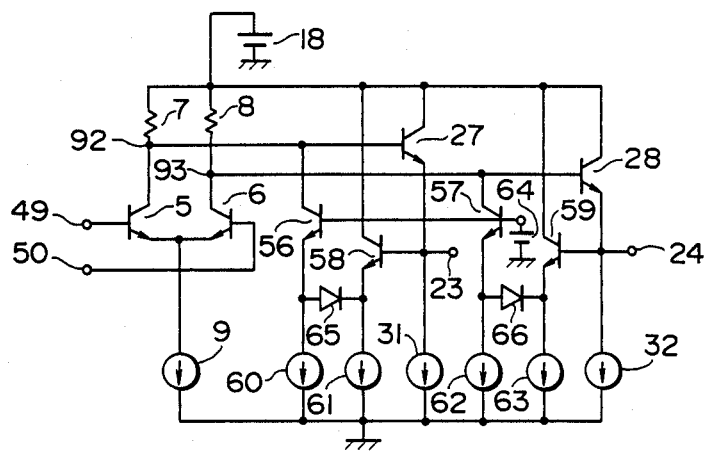

FIG. 21 is a circuit diagram of the eighth embodiment of the invention. It employs junction capacitances of diodes 65 and 66 instead of the fixed compensation capacitance 53 in such a manner that bias voltage levels of the diodes 65 and 66 become equal to those of the transistors 5 and 6. The operation of the circuit is similar to that of the embodiment 7. The voltage level of the node 92 detected by the transistors 27 and 58 is applied to the cathode terminal of the diode 65, whereas to the anode terminal of the diode 65 a d.c. bias current is fed from a d.c. voltage source 64 via a transistor 56. As shown in FIG. 21, these components are arranged in such a manner that with the increase in the voltage of the node 92, a current flowing in the junction capacitance of the diode 65 will flow into the node 92 in proportion to the voltage increase in the node 92. Hence, the junction capacitance of the diode 65 will be seen negative looking into the node 92 resulting in improvement in the bandwidth as the other embodiments mentioned above. It holds true in the case of node 93. In FIG. 21, numerals 57, 58 denote transistors and 60–63 indicate current sources.

EMBODIMENT 9

Figure 22:
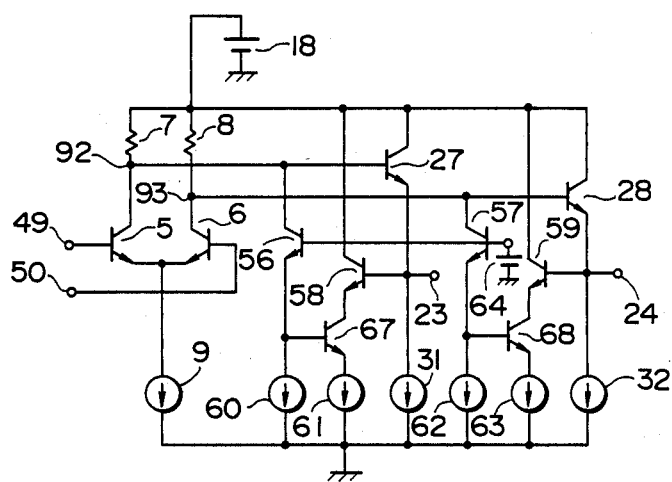

FIG. 22 is a circuit diagram of the ninth embodiment of the invention. This embodiment is obtained by replacing the diodes 65 and 66 of the embodiment 8 with transistors 67 and 68.

EMBODIMENT 10

Figure 23:
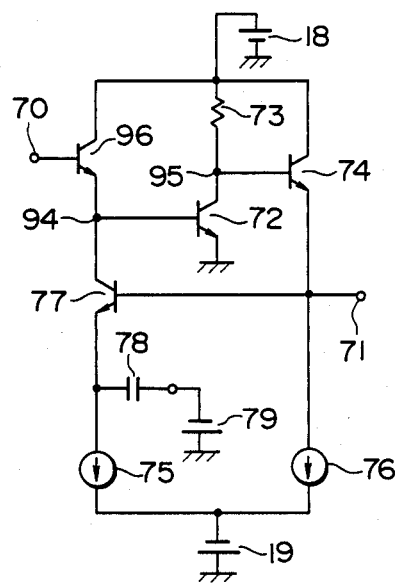

FIG. 23 is a circuit diagram of the tenth embodiment of the invention, wherein the invention is applied to a single-ended amplifier. In order to cancel the input capacitance of a transistor 72, the collector voltage of the transistor 72 is detected by a transistor 74 and applied to a compensation capacitance 78 via a transistor 77. The compensation capacitance 78 converts the voltage to a compensation current. As shown in FIG. 23, these components are arranged in such a manner that with the increase in the voltage of the node 94, the compensation current flowing in the compensation capacitance 78 will flow into the node 94. Hence, the compensation capacitance 78 will be seen negative looking into the node 94 resulting in improvement in the bandwidth as the other embodiments mentioned above.

EMBODIMENTS 11, 12

Figure 24:
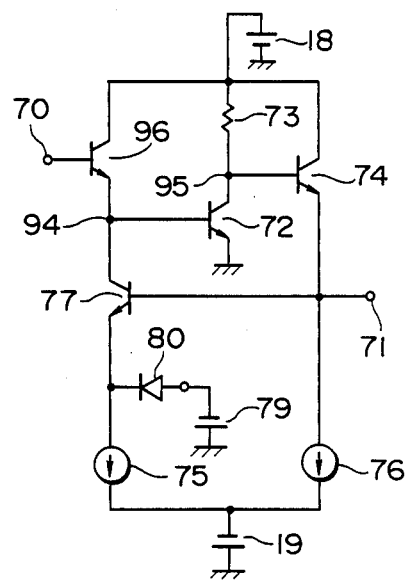
Figure 25:
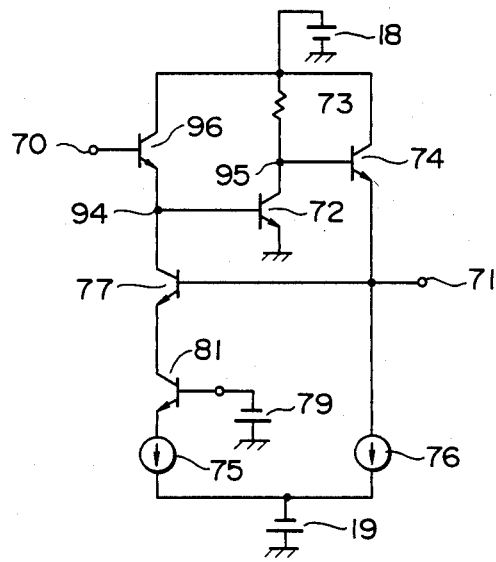

FIG. 24 and 25 are circuit diagrams of the 11th and 12th embodiments of the invention. These embodiments are obtained by replacing the compensation capacitance 78 with junction capacitance of a diode 80 or a transistor 81. A d.c. voltage source 79 is provided for adjusting a bias voltage level applied to the junction capacitance of the diode 80 or transistor 81.

In FIG. 23–25, 19 designates d.c. voltage source, 70 signal input terminal, 71 signal output terminal, 73 a resistor, 75 and 76 current sources, 94 signal input node, 95 signal output node, and 96 a transistor.

EMBODIMENT 13

Figure 26:
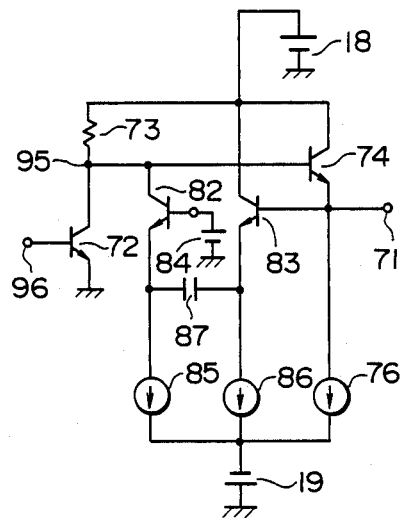

FIG. 26 is a circuit diagram of the 13th embodiment of the invention wherein the invention is applied in order to cancel output capacitance of a single-ended amplifier. Being detected by a transistor 74, the voltage of a node 95 to which a resistor 73 is connected is applied to one terminal of a compensation capacitance 87 via a transistor 83. To the other terminal of the compensation capacitance 87, a d.c. voltage is supplied from a voltage source 84 via a transistor 82. As shown in FIG. 26, these components are arranged in such a manner that with the increase in the voltage of a node 95, the compensation current flowing in the capacitance 87 will flow into the node 95 in proportion to the voltage change of the node 95. As a result, the compensation capacitance 87 will be seen negative looking to the node 95, the bandwidth is improved as the other embodiments.

EMBODIMENTS 14, 15

Figure 27:
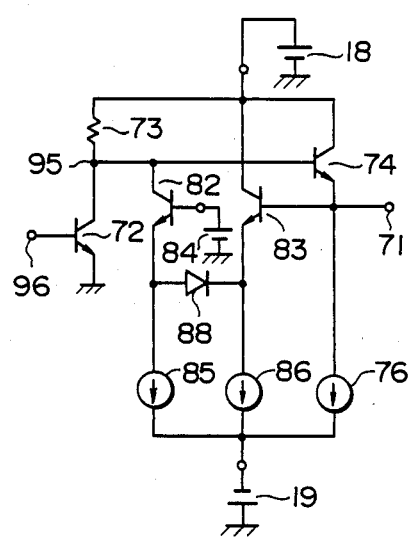
Figure 28:
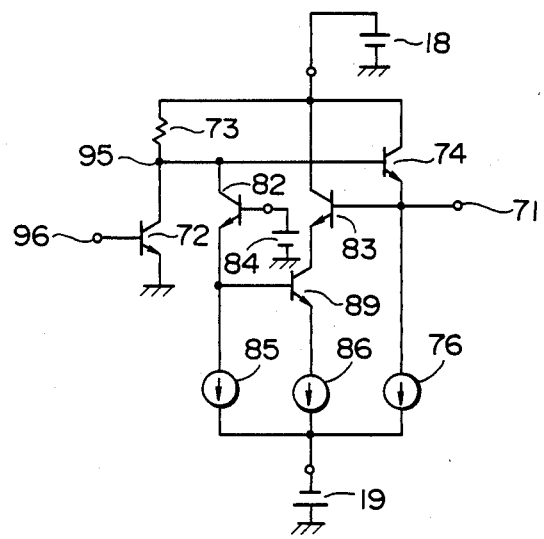

FIG. 27 and 28 are circuit diagrams of the 14th and 15th embodiments of the invention, wherein the compensation capacitance 87 of the embodiment 13 is replaced with a diode 88 or a transistor 89. In FIG. 26–28, numerals 76, 85, 86 indicate current sources, 96 designates a signal input terminal.

EMBODIMENT 16

Figure 29:
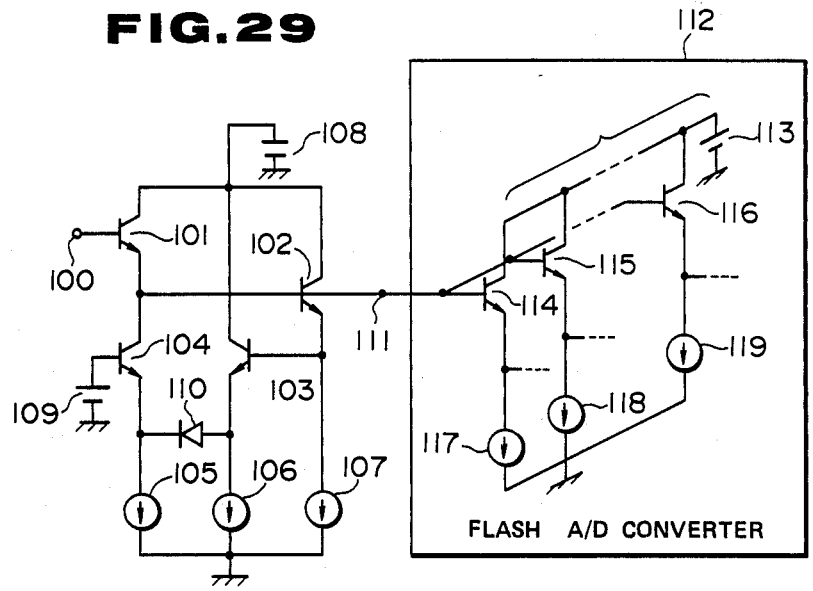

FIG. 29 is a circuit diagram of the 16th embodiment of the invention, wherein the invention is applied to reduce harmonic distortions caused by the voltage dependency of an input capacitance of a flash A/D converter. To a signal input node 111 of the flash A/D converter 112, $2^N$ emitter followers 114–116 are connected, composing a N-bits A/D converter.

In this circuit, a d.c. voltage is supplied to the cathode terminal of a diode 110 from a d.c. voltage source 109 via a transistor 104 so that the diode 110 is reversely biased. On the other hand, the voltage level of the signal input node 111, which is the input terminal to the A/D converter 112, is detected by a transistor 102 and is applied to the anode terminal of the diode 110 via a transistor 103. The voltage is converted to a compensation current by the junction capacitance of the diode 110. As shown in FIG. 29, these components are arranged in such a manner that with the increase in the voltage of the signal input node 111, the compensation current flowing in the diode 110 will flow into the node 111. Hence, the junction capacitance of the diode 110 will be seen negative looking into the signal input node 111. Hence, choosing the junction capacitance of the diode 110 equal to the sum of the base-collector capacitances of the transistors 114, 115, and 116 connected to the node 111 and setting bias voltages of them equal will cancel the input capacitance of the A/D converter 112 at large-signal swing as well as small-signal swing resulting in improvement in the bandwidth and reduction of harmonic distortions.

In FIG. 29, numeral 100 denotes a signal input terminal, 101 a transistor, 105–107, 117–119 current sources, and 108, 113 d.c. voltage sources.

Now, the operational speed of three kind of comparators used as a high-speed comparator for an A/D converter will be compared. These comparators are a conventional comparator (conventional differential amplifier), a base capacitance compensation type comparator according to the present invention (which cancels capacitance parasitic to base terminal), and a collector capacitance compensation type comparator according to the invention (which cancels capacitance parasitic to collector terminal). Whereas the response period tpd of the conventional comparator is 1110 ps, that of the base capacitance compensation type comparator is 606 ps or 45 percent reduction than that of the conventional comparator, and that of the collector capacitance compensation type comparator is 571 ps or 49 percent reduction. Thus, a high-speed amplifier is achieved. The above response period is defined as the elapsed time between the point when the input voltage level $V_{in}$ became higher than the reference voltage level by ½ LSB (about 4mV for an eight bit A/D converter LSI) and the point when the voltage between the two outputs was inverted. Circuit parameters of the above comparators are equal to those associated with FIG. 11.

IMPROVEMENT BY THE INVENTION

Table 1 shows the improvement by the invention in contrast with the conventional compensation techniques. As shown, whereas 1.03-1.39 times of improvement in bandwidth is achieved by conventional compensation techniques, 1.94-2.22 times of improvement can be expected by applying the present invention.

TABLE 1

COMPARISON WITH CONVENTIONAL COMPENSATION TECHNIQUES (compared at the same voltage gain)

|  | conventional techniques | | | the invention | |
|---|---|---|---|---|---|
|  | conventional circuit | peaking Tech. | cascode Tech. | Base-Coll. Comp. | Base Comp | Coll. Comp. |
| 3-dB bandwidth (MHz) | 360 | 500 | 450 | 370 | 700 | 800 |
| improvement (times) | 1 | 1.39 | 1.25 | 1.03 | 1.94 | 2.22 |

RESULTS OBTAINED BY MEASUREMENT

Figure 30:
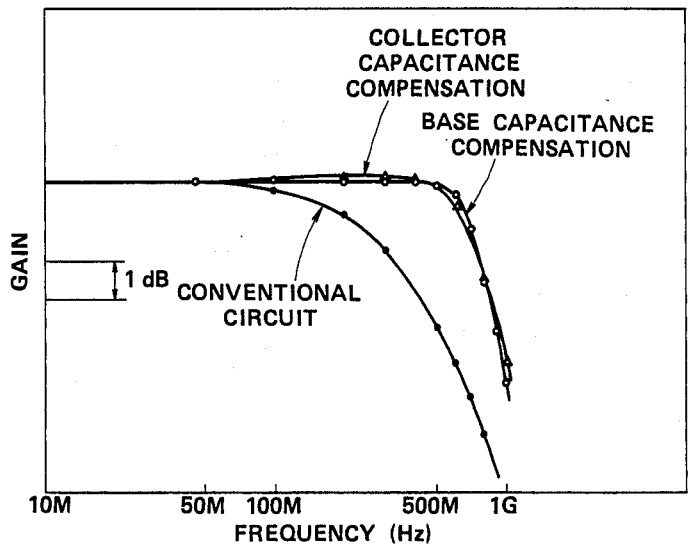

Three experimental models of differential amplifiers are made and their frequency characteristics are measured. These amplifiers are conventional differential amplifier, base-capacitance compensation type differential amplifier wherein the invention is applied for compensating parasitic capacitance to base terminal, and collector-capacitance compensation type differential amplifier wherein the invention is applied for canceling parasitic capacitance to collector terminal. The results of measurement is shown in FIG. 30. Whereas the 3-dB bandwidth of the conventional amplifier is about 410 MHz, that of the base-capacitance compensation type and the collector-capacitance compensation type is about 820 MHz, which is about a factor two improvement in bandwidth. While the wideband amplification according to the present invention have been specifically shown and described herein, the invention itself is not to be restricted by the exact showing of the drawings or the description thereof. For example, although the seventh embodiment compensates the collector capacitance by detecting the collector voltage as shown in FIG. 19, the same compensation circuit will be employed for compensating the base capacitance by detecting the base voltage. Further, although the above mentioned embodiments have been explained about the circuits using bipolar transistors, these transistors may be replaced with FETs such as MOSFET or GaAsMESFET resulting the same effect.

What is claimed is:

1. A wideband amplifier comprising:
(a) a differential amplifier having at least two transistors with two input nodes and two output nodes, said differential amplifier having an input terminal connected to one input node of said two transistors, and another input terminal connected to the other input node of said two transistors, and said differential amplifier having an output terminal connected to one output node of said two transistors, and another output terminal connected to the other output node of said two transistors;
(b) follower circuits for detecting voltage variation of an input node or an output node of each of said transistors;
(c) at least one capacitor connected between output terminals of said follower circuits for producing compensation currents of equal magnitude and of opposite direction to currents flowing in input capacitance of said transistors; and
(d) means for applying one of the compensation currents to one of the input nodes of said transistors, and the other of the compensation currents to the other input node of said transistors.

2. A wideband amplifier comprising:
(a) a differential amplifier having at least two transistors with two input nodes and two output nodes, said differential amplifier having an input terminal connected to one input node of said two transistors, and another input terminal connected to the other input node of said two transistors, and said differential amplifier having an output terminal connected to one output node of said two transistors, and another output terminal connected to the other output node of said two transistors;
(b) follower circuits for detecting voltage variation of an input node or an output node of each of said transistors;
(c) at least one capacitor connected between output terminals of said follower circuits for producing compensation currents of equal magnitude and of opposite direction to currents flowing in output capacitance of said transistors; and
(d) means for applying one of the compensation currents to one of the output nodes of said transistors, and the other of the compensation currents to the other output node of said transistors.

3. A wideband amplifier comprising:
(a) a single-ended amplifier having at least one transistor with an input node and an output node, said single-ended amplifier having an input terminal connected to the input node of the said at least one transistor, and said single-ended amplifier having an output terminal connected to the output node of said at least one transistor;
(b) a follower circuit for detecting voltage variation of the input node or the output node of said at least one transistor;
(c) a transistor junction capacitance directly connected to an output terminal of said follower circuit for producing a compensation current of equal magnitude and of opposite direction to current flowing in input capacitance of said at least one transistor; and
(d) means for applying the compensation current to the input node of said at least one transistor.

4. A wideband amplifier comprising:
(a) a single-ended amplifier having at least one transistor with an input node and an output node, said single-ended amplifier having an input terminal connected to the input node of the said at least one transistor, and said single-ended amplifier having an output terminal connected to the output node of said at least one transistor;
(b) a follower circuit for detecting voltage variation of the input node or the output node of said at least one transistor;
(c) a capacitor connected to an output terminal of said follower circuit for producing a compensation current of equal magnitude and of opposite direction to current flowing in output capacitance of said at least one transistor; and (d) means for applying the compensation current to the output node of said at least one transistor.

5. A wide band amplifier connected to a flash A/D converter, said wideband amplifier comprising:
(a) a follower circuit for detecting voltage variation of an input node of the A/D converter;
(b) a capacitance connected to an output terminal of the follower circuit for producing a compensation current equal and opposite to current flowing in input capacitance of the A/D converter; and
(c) means for applying the compensation current to the input node of the A/D converter.

6. A wideband amplifier comprising:
amplifying means comprising at least one transistor having an input node and an output node; at least one input terminal; means coupling said at least one input terminal to the input node; an output terminal; and means coupling said output terminal to the output node, to effect a voltage variation at the input node and the output node in response to a voltage variation at said at least one input terminal;
wherein said at least one transistor has input capacitance and output capacitance and current flow in the input and output capacitance in response to a voltage applied to the input node;
means for detecting variations in voltage at one of the input node and the output node of said at least one transistor;
means including a transistor junction capacitance directly coupled to said detecting means for producing a compensation current of equal magnitude and opposite direction to current flowing in the input capacitance of said at least one transistor; and
means for applying the compensation current to the input node of said at least one transistor.

7. A wideband amplifier comprising:
amplifying means comprising at least one transistor having an input node and an output node; at least one input terminal; means coupling said at least one input terminal to the input node; an output terminal; and means coupling said output terminal to the output node, to effect a voltage variation at the input node and the output node in response to a voltage variation at said at least one input terminal;
wherein said at least one transistor has input capacitance and output capacitance and current flow in the input and output capacitance in response to a voltage applied to the input node;
means for detecting variations in voltage at one of the input node and the output node of said at least one transistor;
means coupled to said detecting means for producing a compensation current of equal magnitude and opposite direction to current flowing in the output capacitance of said at least one transistor; and
means for applying the compensation current to the output node of said at least one transistor.

8. A wideband amplifier comprising:
amplifying means comprising at least two transistors each having an input node and an output node; at least one input terminal; means coupling said at least one input terminal to an input node; an output terminal; and means coupling said output terminal to an output node, to effect a voltage variation at the input nodes and the output nodes in response to a voltage variation at said at least one input terminal;
wherein said at least two transistors have input capacitances and output capacitances and current flow in the input and output capacitances in response to a voltage applied to the input nodes;
means for detecting variations in voltage at one of an input node and an output node of each of said at least two transistors;
means coupled to said detecting means for producing a compensation current for each of the at least two transistors of equal magnitude and opposite direction to current flowing in the input capacitances thereof; and
means for applying the compensation current to the input node of each of said at least two transistors.

9. A wideband amplifier comprising:
amplifying means comprising at least two transistors each having an input node and an output node; a least one input terminal; means coupling said at least one input terminal to an input node; an output terminal; and means coupling said output terminal to an output node, to effect a voltage variation at the input nodes and the output nodes in response to a voltage variation at said at least one input terminal;
wherein said at least two transistors have input capacitances and output capacitances and current flow in the input and output capacitances in response to a voltage applied to the input nodes;
means for detecting variations in voltage at one of an input node and an output node of each of said at least two transistors;
means coupled to said detecting means for producing a compensation current for each of the at leas two transistors of equal magnitude and opposite direction to current flowing in the output capacitances thereof; and
means for applying the compensation current to the output node of each of said at least two transistors.

* * * * *

UNITED STATES PATENT AND TRADEMARK OFFICE
CERTIFICATE OF CORRECTION

PATENT NO. : 4,885,548

DATED : December 5, 1989

INVENTOR(S) : Tsutomu Wakimoto, et al.

It is certified that error appears in the above-identified patent and that said Letters Patent is hereby corrected as shown below:

1. Column 1, line 9, change "a or" to --or a--.

3. Column 14, line 31 (claim 9), change "a" to --at--.

4. Column 14, line 47 (claim 9), change "leas" to --least--.

Signed and Sealed this

Twelfth Day of May, 1992

Attest:

DOUGLAS B. COMER

Attesting Officer

Acting Commissioner of Patents and Trademarks